(12) United States Patent
Cok et al.

(10) Patent No.: US 6,967,439 B2
(45) Date of Patent: Nov. 22, 2005

(54) OLED DISPLAY HAVING THERMALLY CONDUCTIVE BACKPLATE

(75) Inventors: Ronald S. Cok, Rochester, NY (US); Jesse J. Coleman, Caledonia, NY (US); Andrew D. Arnold, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/785,825

(22) Filed: Feb. 24, 2004

(65) Prior Publication Data

US 2005/0184662 A1 Aug. 25, 2005

(51) Int. Cl.[7] .............................................. H05B 33/00
(52) U.S. Cl. ...................... 313/512; 313/504; 313/45; 313/46
(58) Field of Search .................. 313/498–512, 313/13, 44–46; 428/917; 315/169.3

(56) References Cited

U.S. PATENT DOCUMENTS

| | | |
|---|---|---|
| 6,265,820 B1 | 7/2001 | Ghosh et al. |
| 6,480,389 B1 | 11/2002 | Shie et al. |
| 6,641,933 B1 | 11/2003 | Yamazaki et al. |
| 6,833,671 B2 * | 12/2004 | Peng ........................ 313/506 |
| 6,876,148 B2 * | 4/2005 | Wu et al. ................... 313/512 |

* cited by examiner

*Primary Examiner*—Ashok Patel
(74) *Attorney, Agent, or Firm*—Andrew J. Anderson

(57) ABSTRACT

An OLED display comprises a substrate; one or more OLED light emitting elements including a first electrode formed on the substrate, one or more OLED light emissive layers located over the first electrode, and a second electrode located over the OLED light emissive layers; an encapsulating cover located over the second electrode; and a thermally conductive substantially planar backplate extending over an exterior surface of the encapsulating cover or of the substrate and adhered thereto with a thermally conductive adhesive, the backplate having a thermal conductivity higher than that of the substrate or cover, and the adhesive having a thermal conductivity of greater than 0.2 W/mK, or equal to or greater than the thermal conductivity of the cover or substrate to which it is adhered.

32 Claims, 4 Drawing Sheets

OLED DISPLAY HAVING THERMALLY CONDUCTIVE BACKPLATE

FIELD OF THE INVENTION

The present invention relates to organic light-emitting display devices. In particular, the present invention relates to reducing localized aging due to heating within an organic light-emitting display device.

BACKGROUND OF THE INVENTION

Organic light-emitting diode (OLED) display devices typically include a substrate having one or more OLED light-emitting elements including a first electrode formed thereon, one or more OLED light-emitting layers located over the first electrode, and a second electrode located over the OLED light-emitting layers, and an encapsulating cover located over the second electrode and affixed to the substrate. Such devices may be top-emitting, where the light-emitting elements are intended to be viewed through the cover, and/or bottom-emitting, where the light-emitting elements are intended to be viewed through the substrate. Accordingly, in the case of a bottom-emitting OLED device, the substrate must be largely transparent, and in the case of a top-emitting OLED device, the cover must be largely transparent.

A variety of materials may be used to construct suitable substrates and encapsulating covers for OLED devices. The desirable material properties and/or characteristics of an OLED substrate include low cost, very flat, low coefficient of thermal expansion (CTE), high strength and stability under a variety of environmental stresses, and electrically non-conductive (or able to be coated with electrically non-conductive material on the substrate surface contacting the OLED). It is important that the material forming the substrate on which electrical circuitry is deposited is electrically non-conductive so that any electrical circuitry formed thereon is not shorted. The material used most often for such substrates is glass, typically borosilicate glass, because it is transparent, very stable, can be made at low-cost, and has a very smooth surface suitable for the deposition and processing of semiconductor and organic materials. Other substrate materials have been described in the art, for example ceramics, plastics, and metals such as stainless steel (see U.S. Pat. No. 6,641,933 B1 to Yamazaki et al entitled "Light-emitting EL display device"). However, metals are electrically conductive and so their use typically requires additional electrically non-conductive insulating layers. Metal substrates typically also have a relatively high CTE, which may cause stresses in any materials deposited on the substrate. Metal and glass materials are also used in OLED encapsulating covers, for example in products demonstrated and sold by the Eastman Kodak Company. However, in actual use within products, additional protection or features for the substrate and/or cover are often needed, for example to provide additional shock resistance, environmental protection, or mounting capability.

Organic light-emitting diodes can generate efficient, high-brightness displays. However, heat generated during the operation of the display in high-brightness modes can limit the lifetime of the display, since the light-emitting materials within an OLED display degrade more rapidly when used at higher temperatures. While it is important to maintain the overall brightness of an OLED display, it is even more important to avoid localized degradation within a display. The human visual system is acutely sensitive to differences in brightness in a display. Hence, differences in uniformity are readily noticed by a user. Such localized differences in uniformity in an OLED display may occur as a consequence of displaying static patterns on the display, for example, graphic user interfaces often display bright icons in a static location. Such local patterns will not only cause local aging in an OLED display, but will also create local hot spots in the display, further degrading the light-emitting elements in the local pattern. Glass and plastic supports, the use of which is advantageous in view of their relative electrical non-conductivity, may not be sufficiently thermally conductive to provide a uniform temperature across the substrate when the display is in operation. Hence, improved thermal management techniques may significantly improve the life expectancy of an organic display device.

One method of removing heat from an organic light emitting display device is described in U.S. Pat. No. 6,265,820, entitled, "Heat removal system for use in organic light emitting diode displays having high brightness." The '820 patent describes a heat removal system for use in organic light emitting diode displays. The heat removal assembly includes a heat dissipating assembly for dissipating heat from the organic light emitting device, a heat transfer assembly for transferring heat from the top organic light emitting device to the heat dissipating assembly and a cooling assembly for cooling the organic light emitting display device. While the system of the '820 patent provides a means for heat removal in an OLED application, its efficiency is limited by the presence of a glass substrate having poor thermal conductivity characteristics through which heat generated by the OLED devices must transfer for removal. Moreover, the structure described in the '820 patent is complex, requiring multiple layers and specific, heat transfer materials in contact with delicate OLED layers. The structure also does not provide the practical needs of mounting and protection.

U.S. Pat. No. 6,480,389 to Shie et al entitled "Heat dissipation structure for solid-state light emitting device package" describes a heat dissipation structure for cooling inorganic LEDs and characterized by having a heat dissipating fluidic coolant filled in a hermetically sealed housing where at least one LED chip mounted on a metallic substrate within a metallic wall erected from the metallic substrate. Such an arrangement is complex, requires fluids, and is not suitable for area emitters such as OLEDs.

Heat sinks are also well known in the integrated circuit industry and are applied to cooling large integrated circuits. Such sinks typically are thick and are unsuitable for displays in which limiting the thickness of the display is an important goal.

It is therefore an object of the invention to provide a more uniform distribution of heat within an OLED display and to optimize the removal of heat from an OLED display device to improve the lifetime of the display. It is a further object of the invention to protect the substrate or cover from environmental stress, and physical damage and to provide features for mounting the display.

SUMMARY OF THE INVENTION

In accordance with one embodiment of the invention, an OLED display comprises a substrate; one or more OLED light emitting elements including a first electrode formed on the substrate, one or more OLED light emissive layers located over the first electrode, and a second electrode located over the OLED light emissive layers; an encapsulating cover located over the second electrode; and a thermally conductive substantially planar backplate extending over an exterior surface of the encapsulating cover or of the substrate and adhered thereto with a thermally conductive adhesive, the backplate having a thermal conductivity higher than that of the substrate or cover, and the adhesive having a thermal conductivity of greater than 0.2 W/mK, or equal to or greater than the thermal conductivity of the cover or substrate to which it is adhered.

DETAILED DESCRIPTION OF THE INVENTION

Figure 1A:
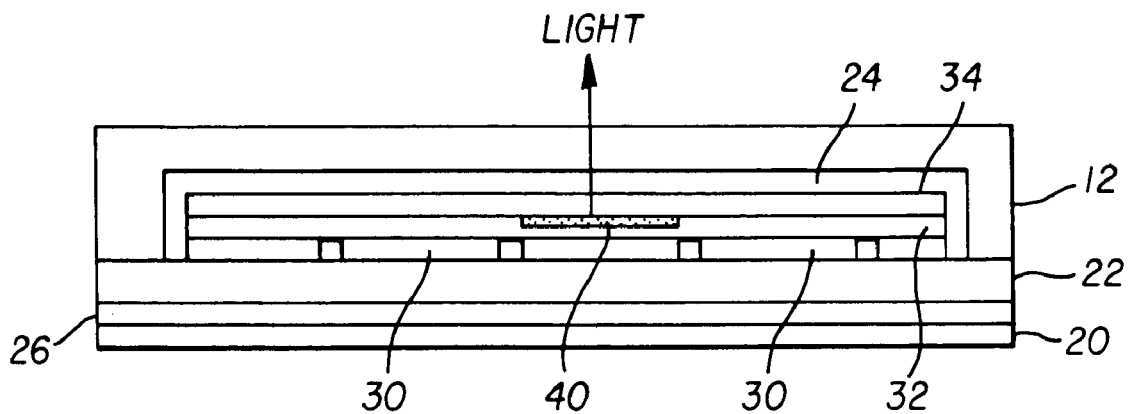
FIG. 1a is a schematic diagram of a top-emitting OLED display according to one embodiment of the present invention.
Figure 1B:
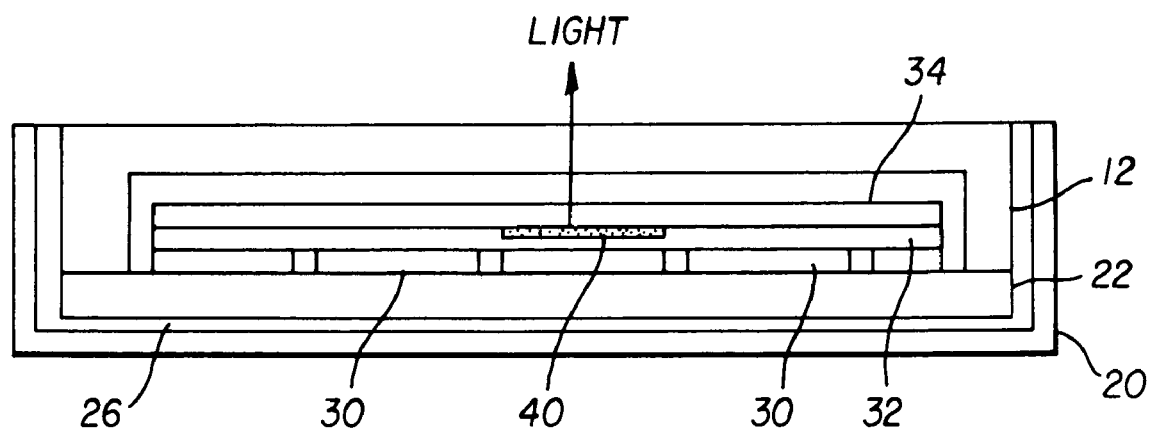
FIG. 1b is a schematic diagram of a top-emitting OLED display according to another embodiment of the present invention.

FIG. 1a illustrates a side view of a top-emitting OLED display in accordance with one embodiment of the present invention. The OLED display includes a substrate 22, one or more OLED light emitting elements each including a first electrode 30 formed on the substrate, one or more OLED light emissive layers 32 located over the first electrode 30, a second electrode 34 located over the OLED light emissive layers 32, gap 24, an encapsulating cover 12 located over the second electrode 34 and affixed to the substrate 22, a thermally conductive adhesive 26, and a thermally conductive backplate 20 adhered to the substrate 22 by the thermally conductive adhesive 26. Back plate 20 is substantially planar and extends over an exterior surface of the substrate 22. In an alternative embodiment shown in FIG. 1b, the substantially planar thermally conductive backplate 20 also extends over the sides of the substrate 22 to protect the edges of the OLED display. The adhesive may, or may not, extend over the sides of the substrate 22 as well. In a top-emitter structure such as that shown in FIGS. 1a and 1b, the encapsulating cover 12 should be as transparent as possible.

Individual light emitting OLED elements are controlled by separate electrodes 30 and may be separated by a plurality of non-emitting regions including circuitry utilizing thin film transistors (TFT) conductors, and other electrical components including, for example, capacitors. The OLED elements may be controlled using passive-matrix or active-matrix techniques, as are known in the art, and may be individually controlled so that some areas within the OLED display are emitting light and others are not.

Top-emitting OLED displays are encapsulated via the encapsulating cover 12 formed of a transparent material, such as glass, thereby allowing the emission light generated by OLED elements to exit the device. Encapsulating cover 12 protects the top-emitting OLED display from moisture or contaminants in the environment. Space between the OLED elements and the encapsulating cover may be filled, e.g., with air, an inert gas, or a polymeric buffer layer. Bottom-emitting OLED displays are likewise encapsulated but, because the light is emitted through the substrate, the substrate must be transparent and the cover may be opaque.

The OLED light-emitting layers 32 may be formed using well-known basic OLED cell structures including stacks of thin organic layers sandwiched between the first and second electrodes 30 and 34. The organic layers typically comprise a hole-injection layer, a hole-transport layer, an emissive layer, and an electron-transport layer. Substrate 22 and cover 12 are typically made of borosilicate glass with a thickness of, for example, 700 microns. Alternatively, plastic materials having barrier layers to prevent OLED material degradation may be employed. However, such materials do not provide as much protection to the OLED device as glass materials in use today.

Thermally conductive adhesives 26 are known in the art and include, for example, double-sided thermally conductive tapes, and epoxies. For the purpose of this invention, an adhesive is required to have a thermal conductivity of greater than 0.2 W/mK to be considered thermally conductive, or to have a thermal conductivity greater than at least one of the substrate or cover. These materials may be applied in a variety of ways including, for example, mechanically attaching, liquid coating, or spraying. The thermally conductive backplate 20 may comprise, for example, a metal such as Al, Cu, Ag, Fe, Cr and Mg and alloys thereof and stainless steel. The backplate 20 may be preformed, for example by stamping, casting, rolling, or other means well known in the art, and shaped to fit over the OLED display and may cover the edges of the OLED display. The thermally conductive backplate 20 may include locating features such as holes or protrusions, with or without threads, to aid in the mounting of the OLED display. For example, small, threaded mounting holes may be provided at the four corners of a rectangular OLED device. In practice, the thermally conductive backplate 20 should be in thermal contact with as much of the encapsulating cover 12 or substrate 22 as possible. Because flat-panel displays such as the present invention must be as thin as possible, the thermally conductive backplate 20 should be as thin as possible, preferably less than 1000 microns and more preferably less than 500 microns. Applicants have demonstrated good results with thermally conductive metal backplates of 300 microns.

Light is emitted from an OLED device when a voltage is applied across the electrodes 30 and 34 to inject and transport holes and electrons into the organic light emissive layers 32 and conduct current through the organic light emissive layers 32 causing the emission of light from the organic light emissive layers 32 in light emitting area 40 where the holes and electrons recombine. Because not all of the energy injected into the organic light emissive layers 32 is converted into light, substantial amounts of energy is converted into heat, causing the temperature of the OLED device to increase. This increase in temperature causes the OLED materials to degrade, become less efficient, and convert less energy into light.

In operation, heat is generated by the light emission of OLED elements (for example, at light emitting area 40). Furthermore, some heat is generated by the circuitry (not shown) within non-emitting regions but to a lesser degree compared with the heat generated by OLED elements. If the OLED light emitting elements are differentially powered, localized hot spots will be formed within the display. These localized hot spots could contribute to differential degradation of the OLED materials in light emitting layer 32, reducing the lifetime of the display. The use of a thermally conductive backplate 20 in thermal contact with the substrate 22 or encapsulating cover 12 provides improved thermal management as further explained below.

Figure 2:
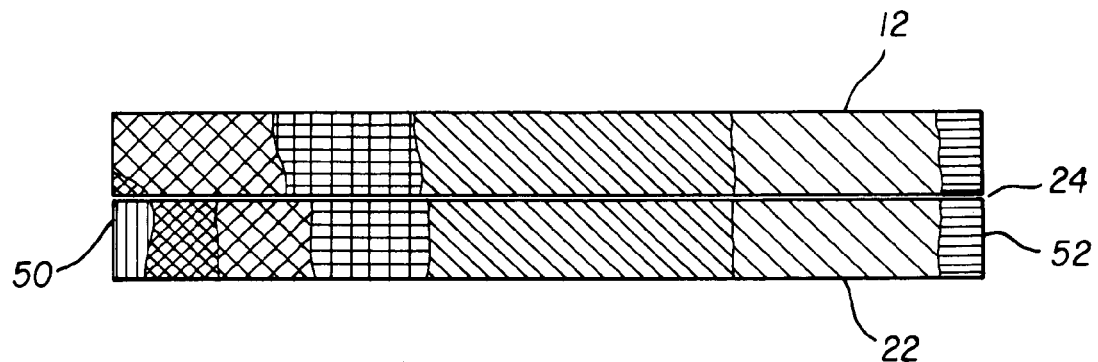
FIG. 2 is a diagram illustrating the heat flow of an OLED as known in the prior art.

Applicant has developed a variety of models for analyzing the heat flow within OLED displays and within various embodiments of the present invention. Referring to FIG. 2, a thermal model of a prior-art OLED device is illustrated. The model is symmetric about the left edge and the left-most portion of the right half is shown here and in the subsequent figures. In this structure, a glass substrate 22 (700 microns thick) is encapsulated by a glass cover 12 (also 700 microns thick). A gap 24 between the substrate 22 and encapsulating glass cover 12 separates the two components. Energy is applied to a point 50 between the cover 12 and the substrate 22. The applied energy raises the temperature of the point 50 to 60° C. The similarly shaded areas in FIG. 2 represent areas with a band of the same approximate temperature. At the rightmost side of the portion of substrate 22 and cover 12 shown in FIG. 2, a temperature band 52 has a temperature of 29 degrees C.

Figure 3:
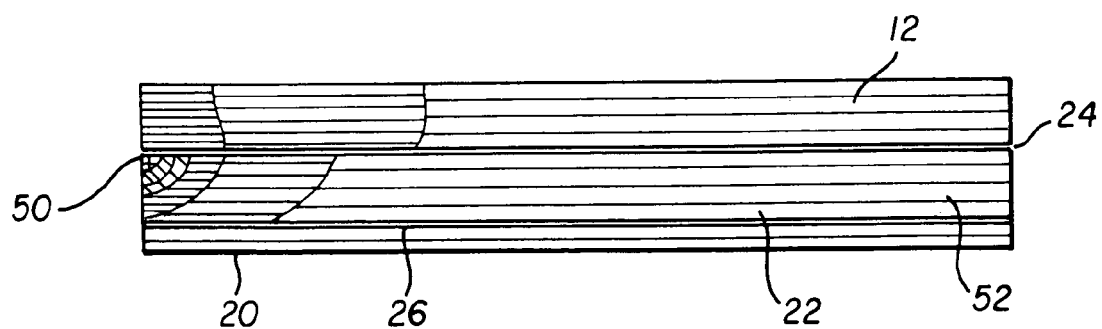
FIG. 3 is a diagram illustrating the heat flow of a top-emitting OLED display as shown in FIG. 1.

Referring to FIG. 3, a thermal model of a top-emitting OLED according to one embodiment of the present invention is illustrated. In this structure, a glass substrate 22 (700 microns thick) is encapsulated by an encapsulating glass cover 12 (also 700 microns thick). The same amount of energy as was applied in the model of FIG. 2 is applied to a point 50 between the cover 12 and the glass substrate 22. A thermally conductive adhesive 26 having a conductivity equal to that of substrate 22 adheres a thermally conductive backplate 20 (having thermal conductivity substantially greater than that of substrate 22) to the substrate 22. The applied energy raises the temperature of point 50 to only 40° C. As in FIG. 2, similarly shaded areas in FIG. 3 represent areas within a band of the same approximate temperature. As can be seen from a comparison of FIGS. 2 and 3, this embodiment of the present invention has significantly lowered the temperature of the OLED device at point 50. While not dissipating heat, the thermally conductive backplate is shown to move heat away from the point 50 to which heat is applied and distributes the heat more evenly across the substrate 22, thereby reducing localized heating at point 50.

Figure 4A:
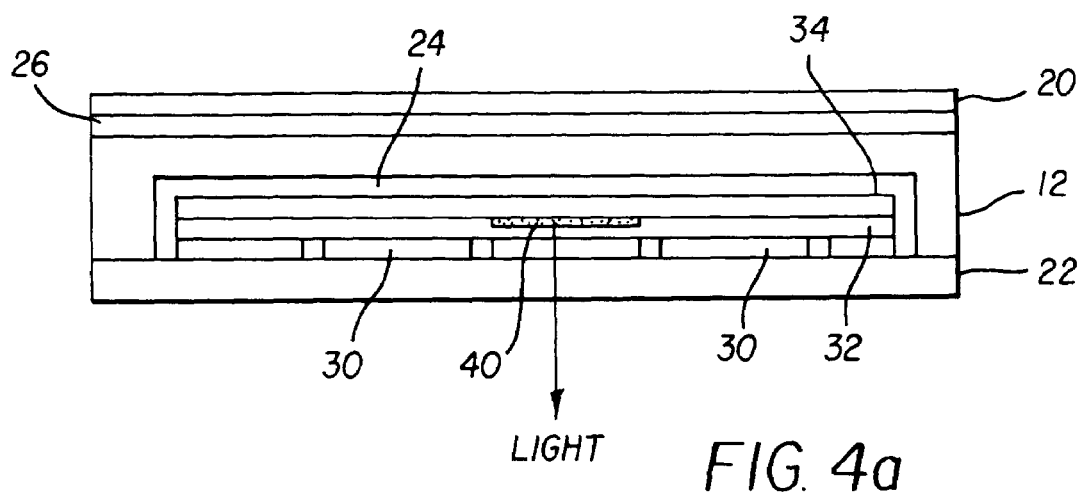
FIG. 4a is a schematic diagram of a bottom-emitting OLED display according to one embodiment of the present invention.
Figure 4B:
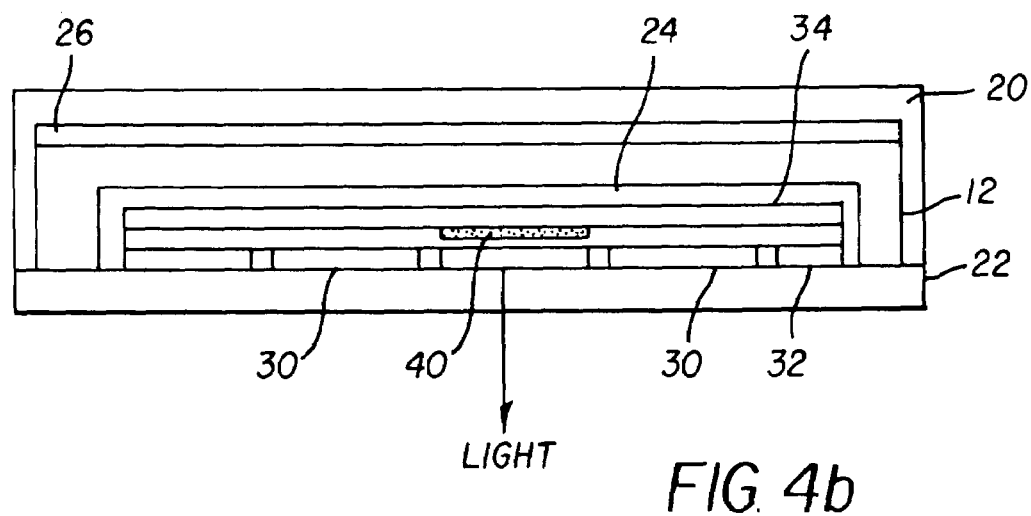
FIG. 4b is a schematic diagram of a bottom-emitting OLED display according to another embodiment of the present invention.
Figure 4C:
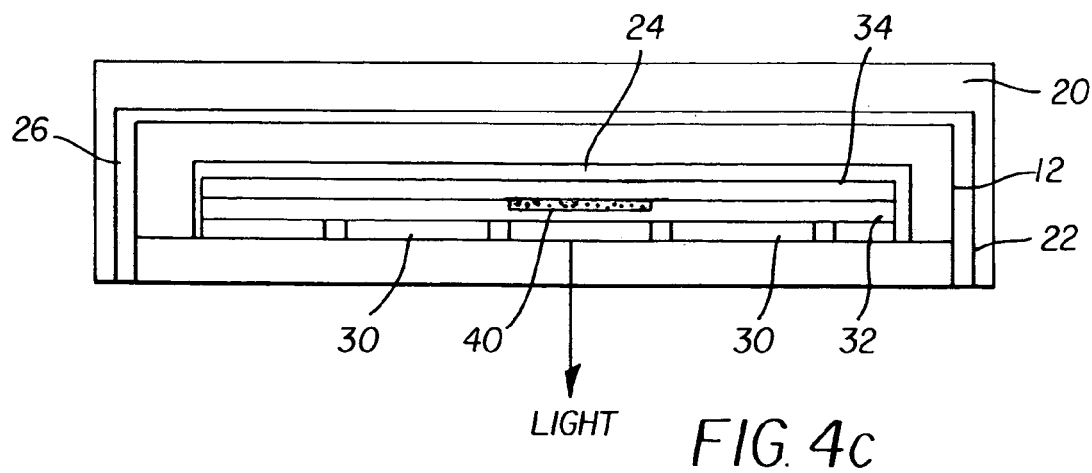
FIG. 4c is a schematic diagram of a bottom-emitting OLED display according to another embodiment of the present invention.

Referring to FIGS. 4a and 4b, in alternative embodiments of the present invention, a side view of a bottom-emitting OLED display is illustrated. The OLED display includes a substrate 22, one or more OLED light emitting elements including a first electrode 30 formed on the substrate, one or more OLED light emissive layers 32 located over the first electrode 30, a second electrode 34 located over the OLED light emissive layers 32, an encapsulating cover 12 located over the second electrode 34 and affixed to the substrate 22, a thermally conductive adhesive 26, and a thermally conductive substantially planar backplate 20 adhered to the encapsulating cover 12 by the thermally conductive adhesive 26. In an alternative embodiment shown in FIG. 4b, the thermally conductive substantially planar backplate 20 also extends over the sides of the encapsulating cover 12 to protect the edges of the OLED display. Thermally conductive adhesive layer 26 also may preferably extend along the sides of the encapsulating cover to provide improved thermal contact. As shown in FIG. 4c, backplate 20 may also extend along the sides of substrate 22, effectively encapsulating the sides thereof.

The bottom emitting OLED device operates similarly to the top-emitting version with the difference that light passes through the substrate rather than through the cover. Accordingly, in the case of the bottom-emitting OLED display, the substrate 22 must be transparent while the encapsulating cover 12 may be opaque.

Figure 5:
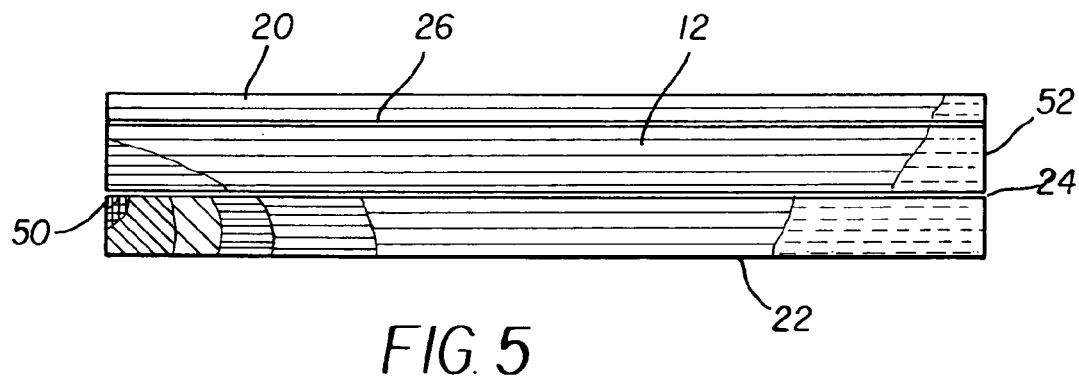
FIG. 5 is a diagram illustrating the heat flow of an OLED display as shown in FIG. 4.

Referring to FIG. 5, a thermal model of a bottom-emitting OLED according to one embodiment of the present invention is illustrated. The same amount of energy as was applied in the prior model of FIG. 2 is applied to a single point 50 on the substrate 22. The applied energy raises the temperature of the point to 43° C. As in FIG. 5, the similarly shaded areas represent areas within a band of the same approximate temperature. The thermally conductive backplate is shown to move heat away from the point 50 to which heat is applied and distributes the heat more evenly across the substrate 22, thereby reducing localized heating. As can be seen from a comparison of the models of FIGS. 2, 3, and 5, the use of a thermally conductive adhesive 26 and thermally conductive backplate 20 according to one embodiment of the present invention has significantly lowered the temperature of the OLED device at point 50.

In both cases (FIGS. 3, and 5), the use of a thermally conductive backplate 20 adhered in thermal contact with either the substrate 22 or encapsulating cover 12 as described in the present invention significantly reduces the local heating of the substrate and cover, and the light-emitting materials deposited in close thermal contact with them. This reduction in heat has the beneficial effect of reducing the aging of the light emitting materials. The modeling work is performed using conventional, commercially available modeling tools.

Applicant has experimentally verified that the present invention provides a reduction in heat due to the OLED operation by employing the thermally conductive adhesive and thermally conductive backplate as described herein. This was done by applying the materials to the OLED as described and operating the OLED in a thermally protected chamber. A thermal imaging camera and thermocouples were used to measure the temperature of the OLED device cover, substrate, and thermally conductive backplate under a variety of operating conditions. Use of adhesives having a thermal conductivity of greater than 0.2 W/mK, more preferably greater than 0.4 W/mK and most preferably greater than 1.0 W/mK resulted in a reduction of localized heating relative to that obtained with a relatively non-thermally conductive adhesive having a thermal conductivity of 0.176 W/mK. Best results were obtained when the thermal adhesive was at least equal to that of the substrate or cover to which the backplate is adhered.

Figure 6:
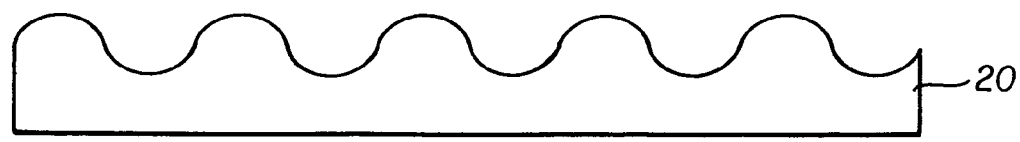
FIG. 6 is a schematic diagram of an embodiment of a thermally conductive backplate according to an embodiment of the present invention.

Unlike conventional heatsinks used with integrated circuits, the present invention is directed towards use of a substantially planar backplate, which is adhered to and extends over an exterior surface of a flat panel display, and is not primarily intended to dissipate heat. Such substantially planar backplates may be flat and smooth on both sides, or if desired may include a corrugated surface that increases the surface area of one side of the backplate, thereby increasing the ability of the thermally conductive backplate to transfer heat to the environment. Referring to FIG. 6, a thermally conductive backplate 20 having one corrugated surface is shown. In this case, the thickness of the conductive backplate 20 varies. The corrugated surface may improve the conduction of heat from the thermally conductive backplate 20 to the ambient environment. In accordance with preferred embodiments, however, the substantially planar backplate is flat on both sides as shown in FIGS. 1 and 4 in order to minimize overall device thickness.

Depending on the size of the substrate 22 or encapsulating cover 12, the thickness of the thermally conductive backplate 20, and the relative coefficients of thermal expansion (CTE) of the materials, problems with a mismatch in heat-related expansion between the substrate/encapsulating cover and the thermally conductive backplate may be encountered. This difficulty may be ameliorated through the use of thermally conductive adhesives that allow movement between the surfaces.

According to the present invention, the substrate 22 or encapsulating cover 12 may be either rigid or flexible. Moreover, the thermally conductive backplate may also be flexible for use therewith. Suitably thin layers of either metals or glasses may be used for either the cover or substrate. In particular, flexible plastics may be employed. Since flexible plastic materials do not effectively seal an OLED display from environmental gases or liquids, the thermally conductive backplate 20 may provide additional protection to the OLED display from the environment. Flexible plastic substrates having environmental barrier layers have been suggested, however, these composite substrates may still be vulnerable to infiltration of environmental contaminants through the edges of the plastic substrate. As discussed above, thermally conductive backplates in accordance with the invention may also encapsulate the edges of the substrates and or covers, providing additional advantageous environmental protection.

Heat additionally may be removed from the OLED display of the present invention by using conventional heatsinks in thermal contact with the thermally conductive backplate 20, for example at the edge of the display. When used within an appliance, the appliance may be placed in thermal contact with the thermally conductive backplate to provide an external heat sink.

The thermally conductive backplate may also be conductive (for example if it is made of metal) and may therefore also be employed to reduce electromagnetic radiation from or into the OLED display. By supplying a ground connection to the conductive backplate, electromagnetic interference from the display or from electrical components near the display may be reduced.

The invention has been described in detail with particular reference to certain preferred embodiments thereof, but it will be understood that variations and modifications can be effected within the spirit and scope of the invention. Accordingly, the preferred embodiments of the invention as described in reference to FIGS. 1 and 4 are intended to be illustrative, not limiting.

PARTS LIST 12 encapsulating cover
20 thermally conductive backplate
22 substrate
24 gap
26 thermally conductive adhesive
30 first electrode
32 OLED light emitting layer
34 second electrode
40 light emitting area
50 energy application point
52 temperature band

What is claimed is:

1. An OLED display comprising:
    a) a substrate;
    b) one or more OLED light emitting elements including a first electrode formed on the substrate, one or more OLED light emissive layers located over the first electrode, and a second electrode located over the OLED light emissive layers;
    c) an encapsulating cover located over the second electrode; and
    d) a thermally conductive substantially planar backplate extending over an exterior surface of the encapsulating cover or of the substrate and adhered thereto with a thermally conductive adhesive, the backplate having a thermal conductivity higher than that of the substrate or cover, and the adhesive having a thermal conductivity of greater than 0.2 W/mK.

2. The OLED display claimed in claim 1 wherein the thermally conductive backplate is made of metal.

3. The OLED display claimed in claim 2 wherein the metal includes one or more elements of the group including aluminum, silver, copper, iron, chromium, or magnesium, or an alloy including at least one of aluminum, silver, copper, iron, chromium, and magnesium.

4. The OLED display claimed in claim 2 wherein the metal is stainless steel.

5. The OLED display claimed in claim 1 wherein the thermally conductive backplate extends to the sides of the encapsulating cover and/or substrate.

6. The OLED display claimed in claim 5, where the adhesive adheres the backplate to the sides of the cover and/or substrate.

7. The OLED display claimed in claim 1 wherein the OLED display is incorporated within an appliance and the thermally conductive backplate is in thermal contact with the appliance.

8. The OLED display claimed in claim 1 wherein the thermally conductive adhesive is one of the group including adhesive tape and epoxy.

9. The OLED display claimed in claim 1 wherein the thermally conductive adhesive is applied as a liquid.

10. The OLED display claimed in claim 1 wherein the thermally conductive adhesive is sprayed onto either the substrate or encapsulating cover.

11. The OLED display claimed in claim 1 wherein the thermally conductive backplate reduces electromagnetic interference.

12. The OLED display claimed in claim 1 wherein the OLED display is a top-emitting display and the thermally conductive backplate is applied to the substrate.

13. The OLED display claimed in claim 1 wherein the OLED display is a bottom-emitting display and the thermally conductive backplate is applied to the encapsulating cover.

14. The OLED display claimed in claim 1 wherein the thermally conductive backplate has mounting features.

15. The OLED display claimed in claim 14 wherein the mounting features include holes and/or protrusions.

16. The OLED display claimed in claim 15 wherein the holes and/or protrusions are threaded.

17. The OLED display claimed in claim 1 wherein the thermally conductive backplate has a variable thickness.

18. The OLED display claimed in claim 17 wherein at least one surface of the thermally conductive backplate is corrugated.

19. The OLED display claimed in claim 1, wherein the substrate is made of plastic.

20. The OLED display claimed in claim 1, wherein the substrate is flexible.

21. The OLED display claimed in claim 1, wherein the thermally conductive backplate encapsulates the edges of the cover and/or substrate.

22. The OLED display claimed in claim 1, wherein the backplate is flexible.

23. An OLED display comprising:
a) a substrate;
b) one or more OLED light emitting elements including a first electrode formed on the substrate, one or more OLED light emissive layers located over the first electrode, and a second electrode located over the OLED light emissive layers;
c) an encapsulating cover located over the second electrode; and
d) a thermally conductive substantially planar backplate extending over an exterior surface of the encapsulating cover or of the substrate adhered thereto with a the thermally conductive adhesive, the backplate having a thermal conductivity higher than that of the substrate or cover, and the adhesive having a thermal conductivity equal to or greater than the thermal conductivity of the cover or substrate to which it is adhered.

24. The OLED display claimed in claim 23 wherein the thermally conductive backplate is made of metal.

25. The OLED display claimed in claim 23 wherein the thermally conductive backplate extends to the sides of the encapsulating cover and/or substrate.

26. The OLED display claimed in claim 25, where the adhesive adheres the backplate to the sides of the cover and/or substrate.

27. The OLED display claimed in claim 23 wherein the OLED display is a top-emitting display and the thermally conductive backplate is applied to the substrate.

28. The OLED display claimed in claim 23 wherein the OLED display is a bottom-emitting display and the thermally conductive backplate is applied to the encapsulating cover.

29. The OLED display claimed in claim 23, wherein the substrate is made of plastic.

30. The OLED display claimed in claim 23, wherein the substrate is flexible.

31. The OLED display claimed in claim 23, wherein the thermally conductive backplate encapsulates the edges of the cover and/or substrate.

32. The OLED display claimed in claim 23, wherein the backplate is flexible.

* * * * *